(12) United States Patent
Seo et al.

(10) Patent No.: US 11,152,056 B1
(45) Date of Patent: Oct. 19, 2021

(54) INTEGRATED ASSEMBLIES

(71) Applicant: Micron Technology, Inc., Boise, ID (US)

(72) Inventors: Seung Yeong Seo, Boise, ID (US); Myung Ho Bae, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/019,644

(22) Filed: Sep. 14, 2020

(51) Int. Cl.
| | |
|---|---|
| *G11C 5/06* | (2006.01) |
| *G11C 11/4097* | (2006.01) |
| *G11C 11/22* | (2006.01) |
| *H01L 29/78* | (2006.01) |
| *G11C 11/408* | (2006.01) |
| *G11C 11/4091* | (2006.01) |
| *H01L 27/108* | (2006.01) |
| *H01L 27/11507* | (2017.01) |

(52) U.S. Cl.
CPC ........ *G11C 11/4097* (2013.01); *G11C 11/221* (2013.01); *G11C 11/2255* (2013.01); *G11C 11/2257* (2013.01); *G11C 11/2273* (2013.01); *G11C 11/4085* (2013.01); *G11C 11/4091* (2013.01); *H01L 27/10808* (2013.01); *H01L 27/11507* (2013.01); *H01L 29/7827* (2013.01)

(58) Field of Classification Search
CPC .............. G11C 11/4097; G11C 11/211; G11C 11/2255; G11C 11/2257; G11C 11/2273; G11C 11/4085; G11C 11/4091; H01L 27/10808; H01L 27/11507; H01L 29/7827
USPC ....................................................... 365/149
See application file for complete search history.

(56) References Cited

U.S. PATENT DOCUMENTS

| | | | | |
|---|---|---|---|---|
| 10,185,674 | B2 * | 1/2019 | Lea, V | G11C 11/4091 |
| 10,268,389 | B2 * | 4/2019 | Lea, V | G06F 3/0659 |
| 10,347,222 | B2 * | 7/2019 | Sasaki | G10B 3/22 |
| 10,366,738 | B2 * | 7/2019 | Derner | H01L 27/10814 |
| 10,446,502 | B2 * | 10/2019 | Bedeschi | G11C 11/4091 |
| 10,607,923 | B1 * | 3/2020 | Juengling | H01L 25/0657 |
| 10,790,286 | B2 * | 9/2020 | Juengling | G11C 11/405 |
| 10,811,083 | B2 * | 10/2020 | Derner | G11C 11/4093 |
| 10,833,059 | B2 * | 11/2020 | Juengling | H01L 23/544 |
| 10,854,617 | B2 * | 12/2020 | Derner | G11C 11/221 |
| 10,861,787 | B1 * | 12/2020 | Sukekawa | H01L 27/10897 |

(Continued)

OTHER PUBLICATIONS

Li, U.S. Appl. No. 16/824,132 titled "Integrated Assemblies Comprising Twisted Digit Line Configurations", filed Mar. 19, 2020, 49 pages.

*Primary Examiner* — Viet Q Nguyen
(74) *Attorney, Agent, or Firm* — Wells St. John P.S.

(57) ABSTRACT

Some embodiments include an integrated assembly having a second deck over a first deck. A true digit-line has a short first region along the first deck and a long second region along the second deck. A complementary digit-line has a long first region along the first deck and a short second region along the second deck. A first set of first memory cells is associated with the true digit-line. The first set includes a first subset along the short first region, a second subset along a portion of the long second region, and a third subset along another portion of the long second region. A routing region of the true digit-line extends between the second and third subsets of the first memory cells. A connection extends from the short first region to the routing region of the true digit-line.

29 Claims, 6 Drawing Sheets

(56) References Cited

U.S. PATENT DOCUMENTS 10,896,722 B1 * 1/2021 Li .................. G11C 11/4094
11,010,085 B2 * 5/2021 Lea, V .............. G06F 3/0685

* cited by examiner

INTEGRATED ASSEMBLIES

TECHNICAL FIELD

Memory arrays (e.g., DRAM arrays). Integrated assemblies comprising vertically-stacked decks.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line, routing line, first linear structure, etc.), and has a source/drain region coupled to a bitline BL (i.e., digit-line, sense line, second linear structure, etc.). In operation, an electric field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b, with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 in order to simplify the drawing). Wordlines WL0-WL7 extend across the arrays, and are coupled with wordline drivers. Digit-lines D0-D8 are associated with the first array (ARRAY-1), and digit-lines D0*-D8* are associated with the second array (ARRAY-2). Sense amplifiers SA0-SA8 are provided between the first and second arrays. Digit-lines at the same height are paired within one another and compared through a sense amplifier (e.g., digit-lines D0 and D0* are paired with one another and compared with the sense amplifier SA0). In a read operation, one of the paired digit-lines may serve as a reference in determining electrical properties (e.g., voltage) of the other of the paired digit-lines.

Performance of memory may be related to the time constant associated with the reading/writing of/to memory cells along a digit-line. The conventional architecture of FIG. 3 shows the sense-amplifier-circuitry (e.g., SA0) coupled to ends of the digit-lines (e.g., D0 and D0*). Thus, a time constant associated with an individual digit-line of the assembly of FIG. 3 is related to the number of memory cells (Cells) along the digit-line, the capacitance of each cell (Cc) and the resistance along the digit line and associated cells (Rc); and may be estimated using the formula Rc*Cc*Cells.

It is desired to develop new memory architectures which can reduce the time constants associated with individual digit-lines.

DETAILED DESCRIPTION OF THE ILLUSTRATED EMBODIMENTS

Some embodiments include integrated assemblies having digit-line-configurations configured to couple inner points of digit-lines to sense-amplifier-circuitry and/or to other regions of the digit-lines vertically displaced relative to the inner points of the digit-lines. Such configurations may improve timing performance (e.g., reduce a total time constant) of the digit-lines relative to conventional digit-line-configurations. Example embodiments are described with reference to FIGS. 4-6.

Figure 4:
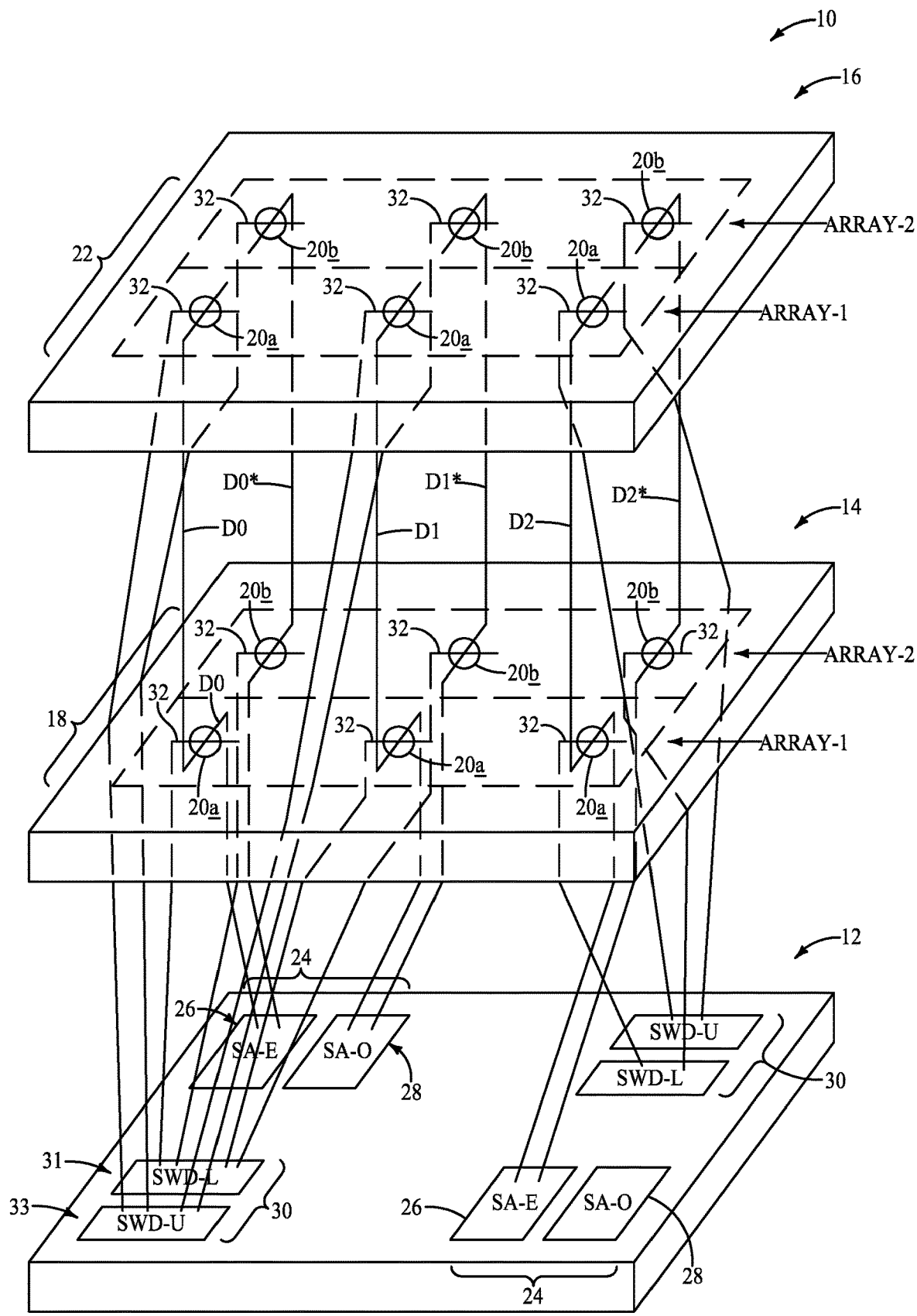
FIG. 4 is a schematic diagram of an example integrated assembly having multiple decks which are vertically displaced relative to one another.

Referring to FIG. 4, an integrated assembly 10 includes a base 12, a first deck 14 over the base, and a second deck 16 over the first deck. The structures 12, 14 and 16 are vertically stacked one atop another. The base 12, first deck 14 and second deck 16 may be considered to be examples of levels (tiers) that are vertically displaced relative to one another. The levels may be within different semiconductor dies, or at least two of the levels may be within the same semiconductor die.

Figure 1:
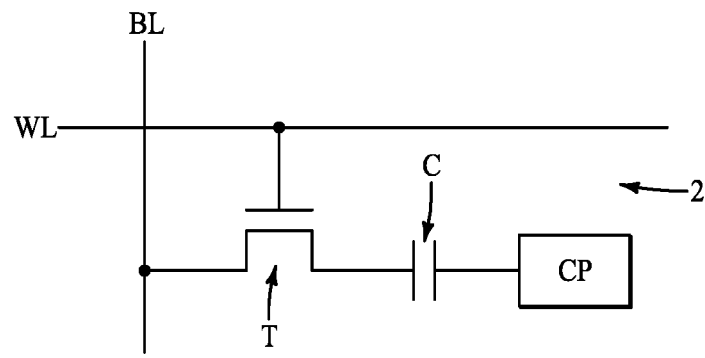
FIG. 1 is a schematic diagram of a prior art memory cell having 1 transistor and 1 capacitor.
Figure 2:
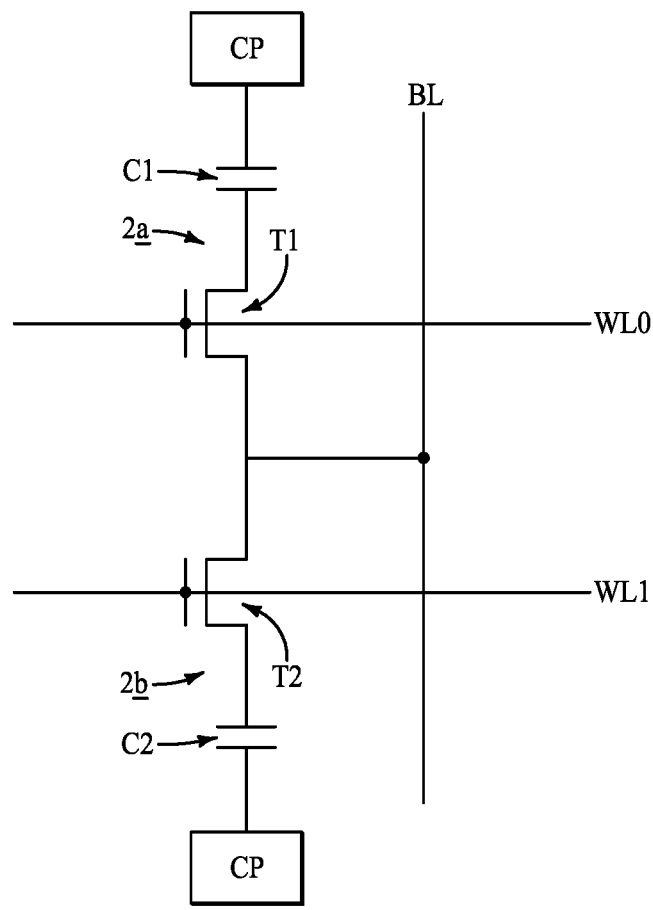
FIG. 2 is a schematic diagram of a pair of prior art memory cells which each have 1 transistor and 1 capacitor, and which share a bitline connection.
Figure 3:
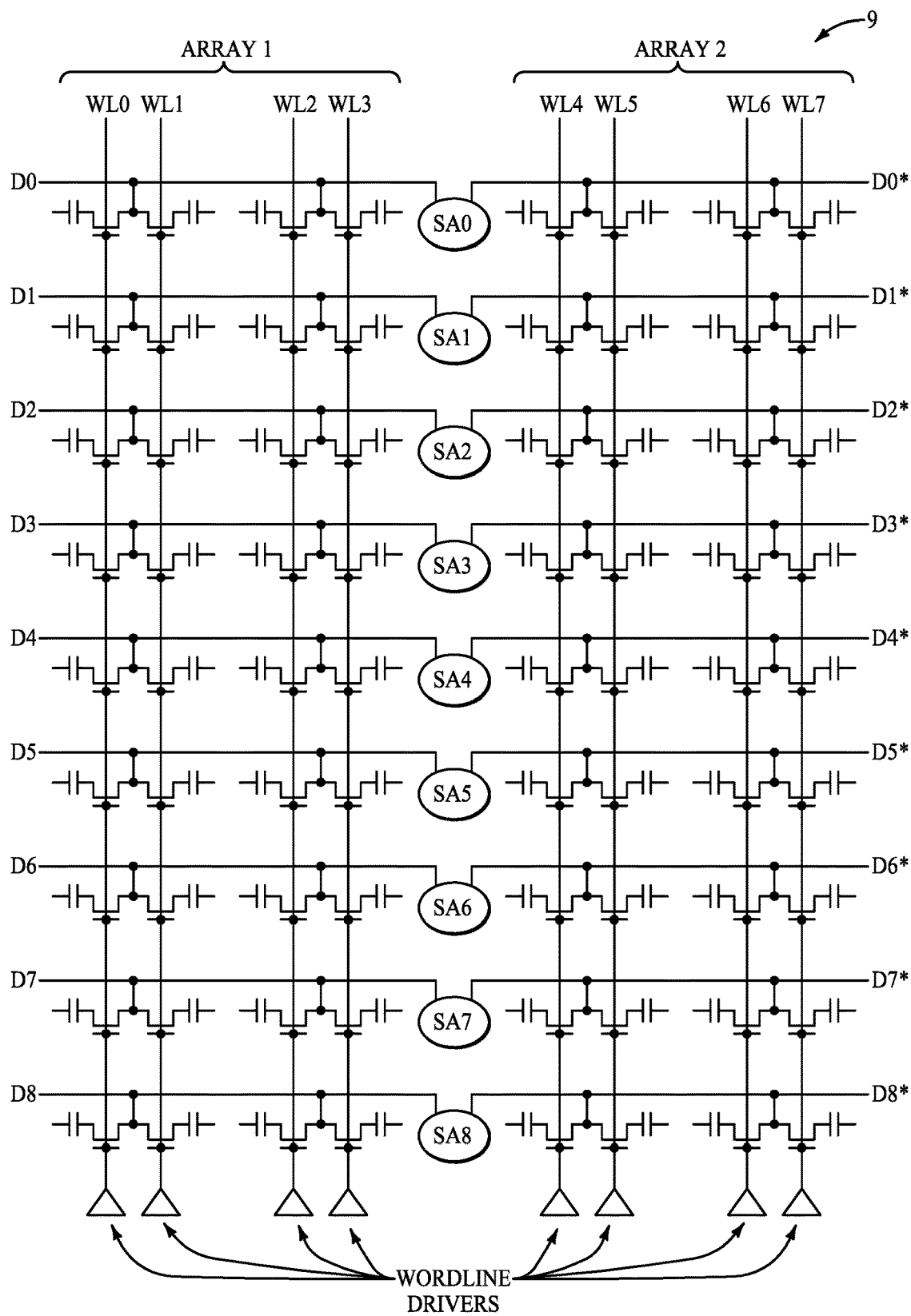
FIG. 3 is a schematic diagram of a prior art integrated assembly having open bitline architecture.

The first and second decks 14 and 16 have memory regions 18 and 22, respectively. First and second memory arrays (ARRAY-1 and ARRAY-2) are supported by the first and second decks 14 and 16, with each of the memory arrays having a first portion along the first (lower) deck 14 and a second portion along the second (upper) deck 16. The first memory array includes first memory cells 20a, and the second memory array includes second memory cells 20b. The memory cells are diagrammatically illustrated as circles. The first and second memory arrays may comprise any suitable number of memory cells, and in some embodiments may comprise hundreds, thousands, millions, etc., of memory cells. The memory cells may be DRAM cells, and in some embodiments may be configured in arrangements of the types described above with reference to prior art FIGS. 1-3 (i.e., ARRAY-1 and ARRAY-2 may be DRAM arrays).

ARRAY-1 and ARRAY-2 are shown to be separated from one another to simplify the illustration of FIG. 4. In some embodiments, regions of ARRAY-1 may laterally overlap regions of ARRAY-2 as is illustrated in the embodiments described below with reference to FIGS. 5-14.

In some embodiments, the first and second decks 14 and 16 may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises SENSE AMPLIFIER circuitry (SA) and WORDLINE DRIVER circuitry (WD).

The SENSE AMPLIFIER circuitry includes regions 26 labeled "SA-E" to identify them as being associated with an "even" portion of a circuit, and regions 28 labeled "SA-O" to identify them as being associated with an "odd" portion of a circuit. The terms "even" and "odd" are arbitrary, and are utilized to distinguish the different sense-amplifier-circuitries from one another. The illustrated configuration has the SENSE AMPLIFIER circuitries SA-O and SA-E paired with one another and distributed as structures (blocks) 24. The SENSE AMPLIFIER circuitries SA-E and SA-O may be referred to as first and second SENSE AMPLIFIER circuitries, respectively. In some embodiments, the SENSE AMPLIFIER circuitries SA-E may be considered to correspond to a first set of the SENSE AMPLIFIER circuitries and the SENSE AMPLIFIER circuitries SA-O may be considered to correspond to a second set of the SENSE AMPLIFIER circuitries; or vice versa.

The WORDLINE DRIVER circuitry (i.e., row-driver circuitry) includes regions labeled SWD-L (regions 31) and SWD-U (regions 33). The acronym SWD stands for sub-wordline-driver, and is utilized to emphasize that the components SWD-L and SWD-U are portions of the general WORDLINE DRIVER circuitry. The WORDLINE DRIVER circuitries SWD-L are utilized during operation of the memory cells associated with the lower deck 14, and the WORDLINE DRIVER circuitries SWD-U are utilized during operation of the memory cells associated with the upper deck 16.

The illustrated configuration has the wordline-driver-circuitries SWD-L and SWD-U paired with one another and distributed as structures (blocks) 30.

The blocks 24 and 30 may be considered to form patch regions. The patch regions may be considered together to form a quilted arrangement of the circuit subunits along the base 12.

First digit-lines D0, D1 and D2 are associated with the first memory array (ARRAY-1). The first digit-lines D0, D1 and D2 extend along the first memory array (ARRAY-1) and are coupled with first memory cells 20a of the first memory array. The digit-lines D0, D1 and D2 are laterally spaced from one another, and may be representative of a large number of substantially identical digit-lines extending across the first memory array; with the term "substantially identical" meaning identical to within reasonable tolerances of fabrication and measurement. The first digit-lines alternate between even first digit-lines and odd first digit-lines, with the digit-lines D0 and D2 being representative of even first digit-lines, and the digit-line D1 being representative of an odd first digit-line. The even first digit-lines (e.g., D0) are coupled with the first SENSE AMPLIFIER circuitry 26 (i.e., SA-E), and the odd first digit-lines (e.g., D1) are coupled with the second SENSE AMPLIFIER circuitry 28 (i.e., SA-O). The first digit-lines D0, D1 and D2 have first portions along the first deck 14, and have second portions along the second deck 16.

Second digit-lines D0*, D1* and D2* are associated with the second memory array (ARRAY-2). The second digit-lines D0*. D1* and D2* extend along the second memory array and are coupled with second memory cells 20b of the second memory array (ARRAY-2). The digit-lines D0*, D1* and D2* are laterally spaced from one another, and may be representative of a large number of substantially identical digit-lines extending across the second memory array. The second digit-lines alternate between even second digit-lines and odd second digit-lines, with the digit-lines D0* and D2* being representative of even second digit-lines, and the digit-line D1* being representative of an odd second digit-line. The even second digit-lines (e.g., D0*) are coupled with the first SENSE AMPLIFIER circuitry 26 (SA-E), and the odd second digit-lines (e.g., D1*) are coupled with the second SENSE AMPLIFIER circuitry 28 (SA-O). The second digit-lines D0*, D1* and D2* have first portions along the first deck 14, and have second portions along the second deck 16.

The even first digit-lines D0 and D2 are comparatively coupled with the even second digit-lines D0* and D2* through the first SENSE AMPLIFIER circuitry 26 (SA-E); and the odd first digit-line D1 is comparatively coupled with the odd second digit-line D1* through the second SENSE AMPLIFIER circuitry 28 (SA-O). For purposes of understanding this disclosure and the claims that follow, a first digit-line is "comparatively coupled" with a second digit-line through a SENSE AMPLIFIER circuitry if the SENSE AMPLIFIER circuitry is configured to compare electrical properties (e.g., voltage) of the first and second digit-lines with one another.

Two digit-lines which are comparatively coupled with one another through SENSE AMPLIFIER circuitry may be considered to include a true digit-line and a complementary digit-line. For instance, the digit-lines D0 and D0* may be considered to be a true digit-line and a complementary digit-line, respectively; and similarly the digit-lines D1 and D1* may be considered to be a true digit-line and a complementary digit-line, respectively. The terms "true" and "complementary" are arbitrary. The electrical values of the true and complementary digit-lines are utilized together during reading/writing operations of memory cells (e.g., 20a, 20b) associated with the true and complementary digit-lines. For purposes of describing the embodiments herein, the true digit-lines will be those indicated without an asterisk in the label (e.g., D0, D1, D2, etc.), and the complementary digit-lines will be those indicated with an asterisk in the label (e.g., D0*, D1*, D2*, etc.).

Referring still to FIG. 4, wordlines 32 extend along the first and second memory arrays (ARRAY-1 and ARRAY-2).

Each of the first memory cells 20a within the first memory array (ARRAY-1) is uniquely addressed by one of the digit-lines extending along the first memory array (e.g., one of the digit-lines D0, D1 and D2), and one of the wordlines 32. Similarly, each of the memory cells 20b within the second memory array (ARRAY-2) is uniquely addressed by one of the digit-lines extending along the second memory array (e.g., one of the digit-lines D0*, D1* and D2*), and one of the wordlines 32. In some embodiments, the digit-lines along the first memory array (ARRAY-1) may be referred to as a first set of digit-lines, while the digit-lines along the second memory (ARRAY-2) are referred to as a second set of digit-lines.

An advantage of the configuration of FIG. 4 is that all of the SENSE AMPLIFIER circuitry and all of the WORDLINE DRIVER circuitry may be provided directly under the memory arrays (ARRAY-1 and ARRAY-2), which may enable tight packing of the memory arrays across a semiconductor substrate; or in other words, which may conserve valuable semiconductor real estate as compared to conventional configurations in which at least some of the SENSE AMPLIFIER circuitry and/or at least some of the WORDLINE DRIVER circuitry is not directly under a memory array. The vertical stacking of regions of the memory arrays (ARRAY-1 and ARRAY-2) may further conserve valuable semiconductor real estate. In the illustrated embodiment of FIG. 4, the digit-lines D0, D0*, D1, D1*, D2 and D2* are all vertically displaced relative to the first and second SENSE AMPLIFIER circuitries SA-E and SA-O, and are vertically displaced relative to the WORDLINE DRIVER circuitries SWD-U and SWD-L.

The arrangement of FIG. 4 shows the digit-lines (e.g., D0 and D0*) coupled to the sense-amplifier-circuitries (e.g., the SA-E circuitry 26) from ends of the digit-lines, analogous to the prior art configuration described above with reference to FIG. 3. In some embodiments, portions of the digit-lines may be coupled from inner points of the digit-lines, rather than being coupled from the ends of the digit-lines, which may improve the time constants associated with the digit-lines. For instance, FIG. 5 shows a region of an example integrated assembly 10 having digit-lines DL0 and DL0* which have portions coupled from inner points of the digit-lines.

The digit-lines DL0 and DL0* are comparatively coupled to one another through SENSE AMPLIFIER circuitry 26 identified as SA. The digit-line DL0 may be referred to as the true digit-line, and the digit-line DL0* may be referred to as the complementary digit-line.

Figure 5:
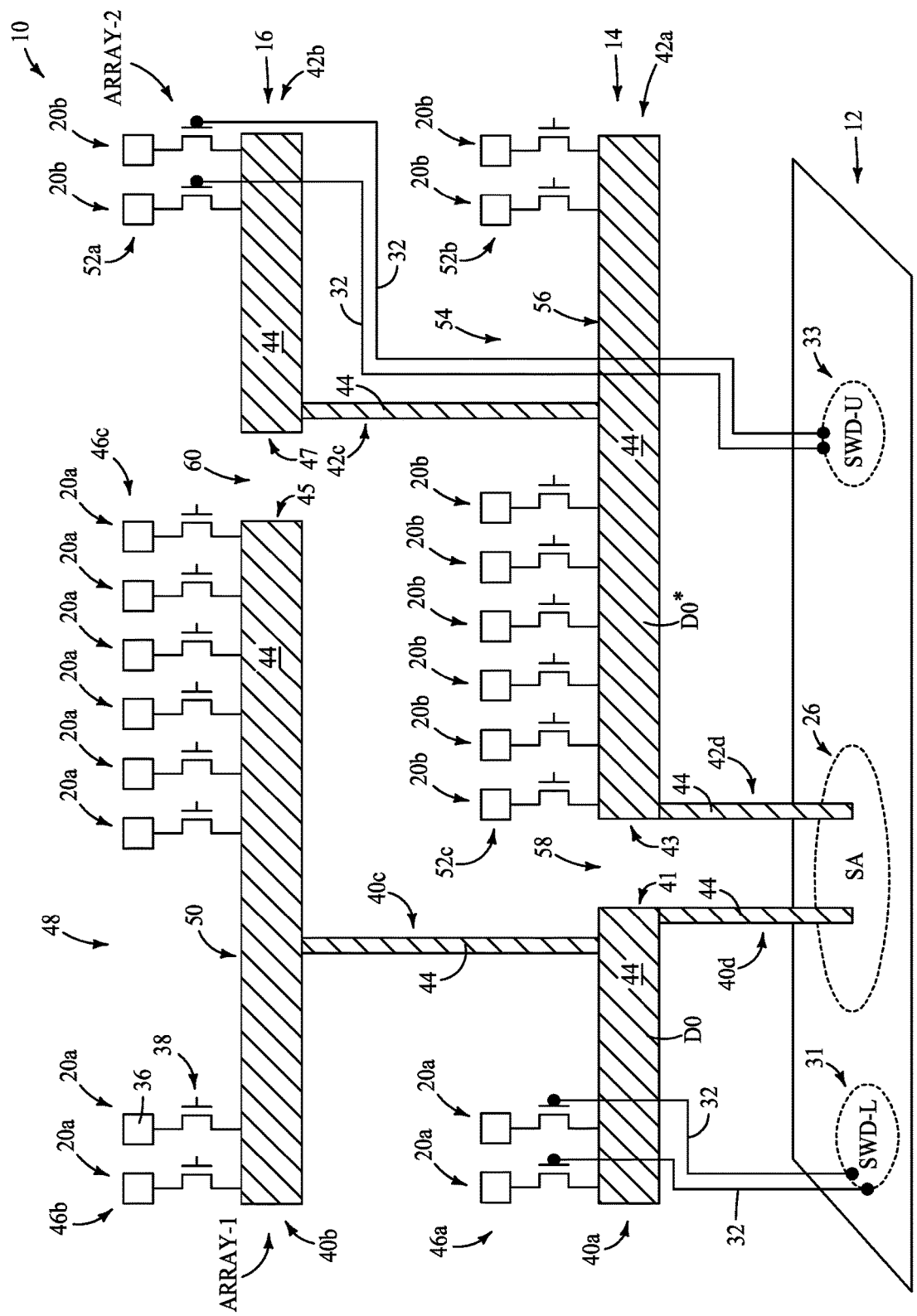
FIG. 5 is a diagrammatic side view of an example layout of an example digit-line and associated memory cells along the example decks of FIG. 4.

The base 12, first deck 14 and second deck 16 are diagrammatically represented in FIG. 5 with different elevational levels. The true digit-line DL0 is illustrated to have a first region 40a along (associated with) the first deck (lower deck) 14, a second region 40b along (associated with) the second deck (upper deck) 16, a vertically-extending segment 40c between the first and second regions 40a and 40b, and another vertically-extending segment 40d between the first region 40a and the sense-amplifier-circuitry 26. The first region 40a is shorter than the second region 40b. In some embodiments, the region 40a may be referred to as a short first region, and the region 40b may be referred to as a long second region.

The complementary digit-line DL0* is illustrated to have a first region 42a along (associated with) the first deck (lower deck) 14, a second region 42b along (associated with) the second deck (upper deck) 16, a vertically-extending segment 42c between the first and second regions 42a and 42b, and another vertically-extending segment 42d between the first region 42a and the sense-amplifier-circuitry 26. The first region 42a is longer than the second region 42b. In some embodiments, the region 42a may be referred to as a long first region, and the region 42b may be referred to as a short second region.

Example memory cells 20a and 20b are shown along elevational levels corresponding to the decks 14 and 16, and some of the wordlines 32 are also diagrammatically illustrated.

Each of the example memory cells 20a and 20b comprises a storage element 36 and an access device 38.

The storage elements 36 may be any suitable devices having at least two detectable states; and in some embodiments may be, for example, capacitors, resistive-memory devices, conductive-bridging devices, phase-change-memory (PCM) devices, programmable metallization cells (PMCs), etc. If the storage elements are capacitors, they may be either ferroelectric capacitors (i.e., may comprise ferroelectric insulative material between a pair of capacitor electrodes) or may be non-ferroelectric capacitors (i.e., may comprise only non-ferroelectric insulative material between a pair of capacitor electrodes). Example ferroelectric insulative material may include one or more of transition metal oxide, zirconium, zirconium oxide, niobium, niobium oxide, hafnium, hafnium oxide, lead zirconium titanate, and barium strontium titanate. Example non-ferroelectric insulative material may comprise, consist essentially of, or consist of silicon dioxide.

The access devices 38 may be transistors (as shown), or any other suitable access devices.

Each of the memory cells 20a of ARRAY-1 is uniquely addressed by the true digit-line (DL0) and one of the wordlines 32. Similarly, each of the memory cells 20b of ARRAY-2 is uniquely addressed by the complementary digit-line (DL0*) and one of the wordlines 32. Only some of the wordlines 32 are illustrated in order to simplify the drawing of FIG. 5. The wordlines along the lower deck 14 are coupled with the WORDLINE DRIVER circuitry SWD-L, and the wordlines along the upper deck 16 are coupled with the WORDLINE DRIVER circuitry SWD-U.

The digit-lines DL0 and DL0* of FIG. 5 comprise conductive material 44. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the memory cells 20a associated with the true digit-line D0 may be considered to be first memory cells, and may be together considered as a first set of memory cells. The first set of the first memory cells may be considered to include a first subset 46a along the short first region 40a, a second subset 46b along a portion of the long second region 40b, and a third subset 46c along another portion of the long second region 40b. The second subset 46b is directly over the first subset 46a in the shown embodiment.

A gap 48 is between the second subset 46b and the third subset 46c, and a routing region (interconnecting region) 50 of the digit-line D0 extends across the gap 48 and between the second and third subsets 46b and 46c.

In some embodiments, the memory cells 20b associated with the complementary digit-line D0* may be considered to be second memory cells, and may be together considered as a second set of memory cells. The second set of the second memory cells may be considered to include a first subset 52*a* along the short second region 42*b*, a second subset 52*b* along a portion of the long first region 42*a*, and a third subset 52*c* along another portion of the long first region 42*a*. The second subset 52*b* is directly under the first subset 52*a* in the shown embodiment.

A gap 54 is between the second subset 52*b* and the third subset 52*c*, and a routing region (interconnecting region) 56 of the digit-line D0* extends across the gap 54 and between the second and third subsets 52*b* and 52*c*.

The interconnect 40*c* may be considered to be a first connection which extends from the short first region 40*a* to the routing region 50 of the true digit-line D0, and the interconnect 42*c* may be considered to be a second connection which extends from the short second region 42*b* to the routing region 56 of the complementary digit-line D0*.

In some embodiments, the short first region 40*a* and the long first region 42*a* along the lower deck 14 may be considered to be spaced from one another by an intervening gap 58, and similarly the short second region 42*b* and the long second region 40*b* along the upper deck 16 may be considered to be spaced from one another by an intervening gap 60.

The regions 40*a* and 42*a* have ends 41 and 43, respectively, which are adjacent the gap 58. In some embodiments, the ends 41 and 43 may be considered to be nearby one another, and nearby the gap 58, and may be referred to as nearby ends of the regions 40*a* and 42*a*, respectively.

The regions 40*b* and 42*b* have ends 45 and 47, respectively, which are adjacent the gap 60. In some embodiments, the ends 45 and 47 may be considered to be nearby one another, and nearby the gap 60, and may be referred to as nearby ends of the regions 40*b* and 42*b*, respectively.

The connection 40*d* from the region 40*a* of the true digit-line D0 to the SENSE AMPLIFIER circuitry 26 extends downwardly from proximate the nearby end 41 of such region. Similarly, the connection 42*d* from the region 42*a* of the complementary digit-line D0* to the SENSE AMPLIFIER circuitry 26 extends downwardly from proximate the nearby end 43 of such region.

The connection 40*c* from the short first region 40*a* to the routing region 50 of the true digit-line D0 extends upwardly from proximate the end 41. Similarly, the connection 42*c* from the short second region 42*b* to the routing region 56 of the complementary digit-line D0* extends downwardly from proximate the end 47.

The connections 40*c* and 42*c* extend to inner points along the long portions 40*b* and 42*a* of the digit-lines D0 and D0*, respectively, with such inner points being along the routing regions 50 and 56. The inclusion of the connections 40*c* and 42*c* extending to the inner points of the digit-lines may reduce the effective time constant associated with the digit-lines, and may thereby improve the timing performance. For instance, in the illustrated embodiment, there are 10 first memory cells 20*a* along the true digit-line D0. Six of the first memory cells 20*a* are within the third subunit 46*c*, and two of the first memory cells 20*a* are within the second subunit 46*b*. In operation, the memory cells within the second subunit 46*b* may be discharged simultaneously with the memory cells along the third subunit 46*c* which may reduce the effective time constant for the digit-line D0 as compared to conventional digit-lines which are coupled to ends of the digit-lines rather than to internal points of the digit-lines. Specifically, the effective time constant for the digit-line D0 of FIG. 5 may be $Rc*Cc*3/4(Cells)$, where Rc, Cc and Cells are defined above in describing FIG. 3. Similarly, the effective time constant for the digit-line D0* of FIG. 5 may be $Rc*Cc*3/4(Cells)$.

In the illustrated embodiment, the first and second subsets 46*a* and 46*b* of the first memory cells 20*a* have the same number of memory cells (shown as two) as one another. In other embodiments, the first and second subsets of the first memory cells may have different numbers of memory cells relative to one another. Similarly, the first and second subsets 52*a* and 52*b* of the second memory cells 20*b* may have the same number of memory cells as one another (as shown) or may have different numbers of memory cells relative to one another.

The third subset 46*c* of the first memory cells 20*a* comprises more memory cells than the first subset 46*a* and the second subset 46*b*. In some embodiments, the third subset 46*c* may comprise at least twice as many of the memory cells as one or both of the first and second subsets 46*a* and 46*b*, at least three-times as many of the memory cells as one or both of the first and second subsets 46*a* and 46*b*, at least four-times as many of the memory cells as one or both of the first and second subsets 46*a* and 46*b*, etc. Similarly, the third subset 52*c* may comprise at least twice as many memory cells 20*b* as one or both of the first and second subsets 52*a* and 52*b*, at least three-times as many memory cells 20*b* as one or both of the first and second subsets 52*a* and 52*b*, at least four-times as many memory cells 20*b* as one or both of the first and second subsets 52*a* and 52*b*, etc.

Figure 6:
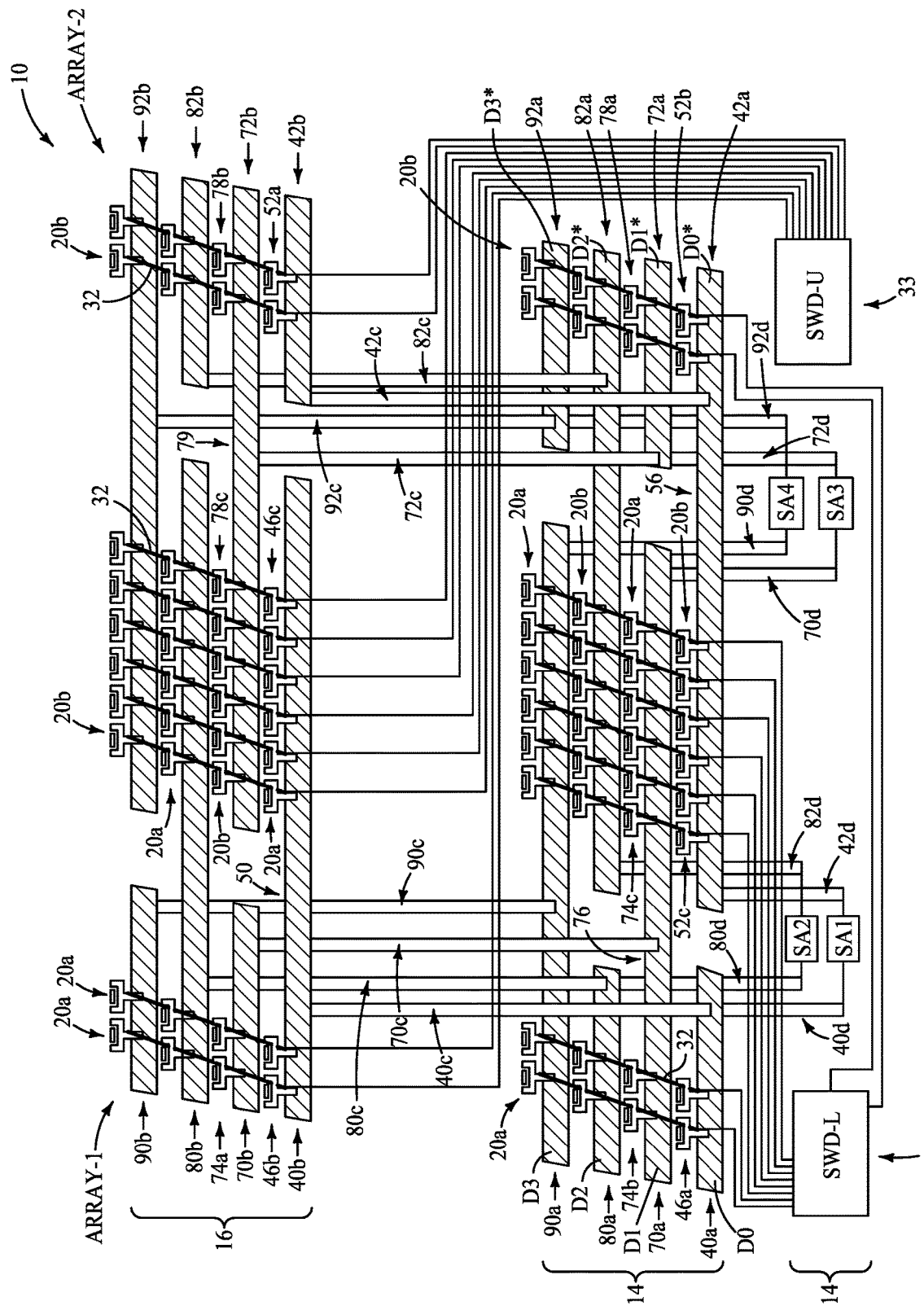
FIG. 6 is a diagrammatic multi-dimensional side view of an example layout of example digit-lines and associated memory cells along the example decks of FIG. 4.

FIG. 6 shows another embodiment of the integrated assembly 10, with such embodiment being expanded beyond the illustrated region of FIG. 5. The embodiment of FIG. 6 includes the digit-lines D0 and D0* described above with reference to FIG. 5, and also includes analogous digit-lines D1, D2, D3, D1*, D2* and D3*.

The first and second decks 14 and 16 are shown diagrammatically as being at different elevational levels within the illustration of FIG. 6, and are shown to be over the base 12.

The base 12 comprises several sense-amplifier-circuitries (SA1-SA4) and comprises the wordline-driver-circuitries 31 and 33.

The first deck 14 may be considered to comprise a first portion of the first array (Array-1) of the first memory cells 20*a*, and to comprise a first portion of the second array (Array-2) of the second memory cells 20*b*; and the second deck 16 may be considered to comprise a second portion of the first array of the first memory cells 20*a*, and to comprise a second portion of the second array of the second memory cells 20*b*.

The memory cells 20*a* and 20*b* may have any suitable configuration. An example memory cell 20 is shown in enlarged view in FIG. 6A to simplify the labeling of the components of the memory cell. The memory cell 20 includes a transistor T coupled with a capacitor C. The transistor T comprises a vertically-extending pillar 200 of semiconductor material 202. The semiconductor material 202 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

Gate dielectric material (insulative material) 204 is along sidewalls of the pillar 200, and conductive gate material 206 is along the gate dielectric material.

The gate dielectric material 204 may comprise any suitable composition(s); and in some embodiments may comprise, consist essentially of, or consist of silicon dioxide.

The conductive gate material 206 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive gate material 206 forms a transistor gate of the transistor T. The transistor also includes a first source/drain region 216 within an upper region of the pillar 200, a second source/drain region 218 within a lower region of the pillar 200, and a channel region 220 between the first and second source/drain regions 216 and 218. In operation, an electric field generated by voltage within the gate material 206 (i.e., voltage along a wordline 32 coupled with the gate material 206) may gatedly couple the source/drain regions 216 and 218 to one another through the channel region 220. When the term "gated coupling" is utilized herein, such may refer to the controlled coupling/decoupling of source/drain regions of a transistor that may be induced by electrical activation/deactivation of the gate of the transistor.

The capacitor C comprises a first conductive node 228, a second conductive node 230, and an insulative material (capacitor dielectric material) 232 between the first and second conductive nodes.

The first and second conductive nodes 228 and 230 may comprise any suitable electrically conductive composition (s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another.

The insulative material 232 may comprise any suitable composition(s), and in some embodiments may comprise, consist essentially of, or consist of silicon dioxide.

In the shown embodiment, the lower conductive node 228 is configured as an upwardly-opening container. In other embodiments, the lower conductive node may have other suitable shapes.

Figure 6A:
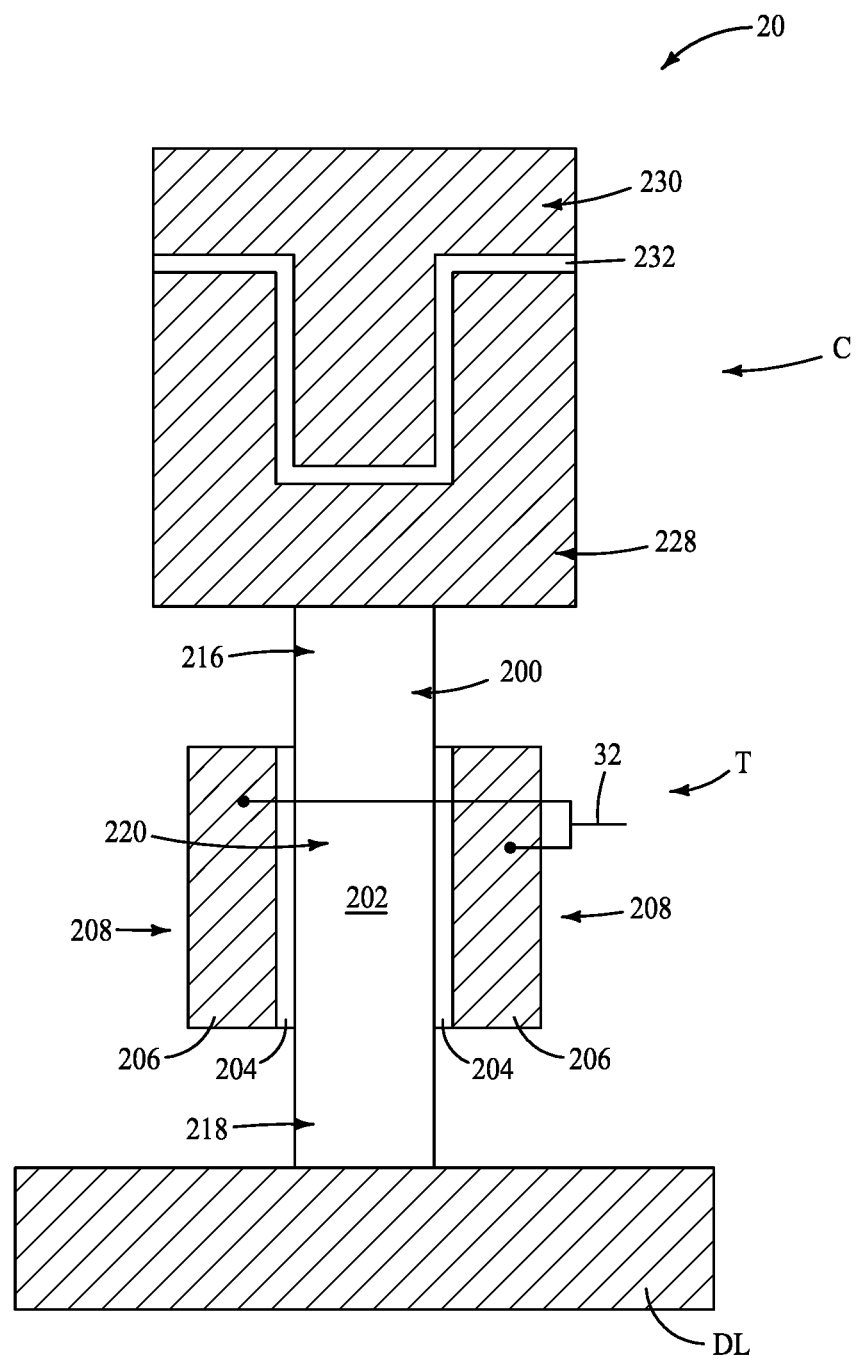
FIG. 6A is a diagrammatic cross-sectional side view of one of the example memory cells of FIG. 6.

The wordlines 32 (gate material 206) are on two sides of the channel region 220 in the view of FIG. 6A, and are on one side of the channel regions in the view of FIG. 6. The wordlines (gate material), may be in any suitable configuration relative to the channel regions of the transistors; and in some applications may be on one side of the channel regions, on two sides of the channel regions, or may entirely surround the channel regions (i.e., may be in a gate-all-around configurations).

The transistor T of FIG. 6A is shown to be a vertically-extending transistor, and specifically is shown to have a channel region 220 which extends vertically. In the illustrated embodiment, the channel region extends orthogonally (or at least substantially orthogonally) relative to a horizontally-extending upper surface of the illustrated digit-line DL. The term "substantially orthogonally" means orthogonally to within reasonable tolerances of fabrication and measurement. In some embodiments, the channel region 220 may extend approximately vertically relative to the horizontally-extending upper surface of the digit-line DL, and may, for example, extend at an angle of 90°±15° relative to the horizontally-extending upper surface of the digit-line DL.

Referring again to FIG. 6, the digit-lines D1, D2, D3, D1*, D2* and D3* comprise regions 70, 80, 90, 72, 82 and 92 analogous to the regions 40 and 42 described relative to the digit-lines D0 and D0* of FIG. 5.

In some embodiments, the digit-line D0 may be considered to be a first true digit-line which is associated with the first array (Array-1) comprising the first memory cells 20a. The first true digit-line has the first region 40a associated with the first deck 14 and the second region 40b associated with the second deck 16, with the second region being longer than the first region. The first subset 46a of the first memory cells 20a is associated with the first region 40a of the first true digit-line D0, and the second and third subsets 46b and 46c of the first memory cells 20a are associated with the second region 40b of the first true digit-line. The third subset 46c is laterally displaced from the second subset 46b by the routing region 50 of the first true digit-line D0.

The digit-line D0* may be considered to be a first complementary digit-line which is associated with the second array (Array-2) comprising the second memory cells 20b. The first complementary digit-line has the first region 42a associated with the first deck 14 and the second region 42b associated with the second deck 16, with the second region being shorter than the first region. The first subset 52a of the second memory cells 20b is associated with the second region 42b of the first complementary digit-line D0*, and the second and third subsets 52b and 52c of the second memory cells 20b are associated with the first region 42a of the first complementary digit-line. The third subset 52c is laterally displaced from the second subset 52b by the routing region 56 of the first complementary digit-line D0*.

The digit-lines D0 and D0* are comparatively coupled to one another through the SENSE AMPLIFIER circuitry SA1 (which may be referred to as first SENSE AMPLIFIER circuitry).

The digit-line D1 may be referred to as a second true digit-line associated with the first array (Array-1) comprising the first memory cells 20a (with the memory cells along the digit-line D1 being referred to as third memory cells in some embodiments). The second true digit-line has a first region 70a associated with the first deck 14 and the second region 70b associated with the second deck 16, with the second region being shorter than the first region. A first subset 74a of the first memory cells 20a is associated with the second region 70b of the second true digit-line D1, and second and third subsets 74b and 74c of the first memory cells 20a are associated with the first region 70a of the second true digit-line. The third subset 74c is laterally displaced from the second subset 74b by a routing region 76 of the second true digit-line D1. In the illustrated embodiment, the second subset 74b is directly under the first subset 74a.

The digit-line D1* may be considered to be a second complementary digit-line which is associated with the second array (Array-2) comprising the second memory cells 20b (with the memory cells along the digit-line D1* being referred to as fourth memory cells in some embodiments). The second complementary digit-line has a first region 72a associated with the first deck 14 and the second region 72b associated with the second deck 16, with the second region being longer than the first region. A first subset 78a of the second memory cells 20b is associated with the first region 72a of the second complementary digit-line D1*, and second and third subsets 78b and 78c of the second memory cells 20b are associated with the second region 72b of the second complementary digit-line. The third subset 78c is laterally displaced from the second subset 78b by a routing region 79 of the second complementary digit-line D1*. In the illustrated embodiment, the second subset 78b is directly over the first subset 74a.

The digit-lines D1 and D1* are comparatively coupled to one another through the SENSE AMPLIFIER circuitry SA3 (which may be referred to as second SENSE AMPLIFIER circuitry).

In the illustrated embodiment, a first portion of the first region 70a of the second true digit-line D1 may be considered to be laterally adjacent the first region 40a of the first true digit-line D0, and a second portion of the first region 70a of the second true digit-line D1 may be considered to be laterally adjacent to a portion of the first region 42a of the first complementary digit-line D1*. Further, the second region 70b of the second true digit-line D1 may be considered to be laterally adjacent a portion of the second region 40b of the first true digit-line D0.

In the illustrated embodiment, a first portion of the second region 72b of the second complementary digit-line D1* may be considered to be laterally adjacent the second region 42b of the first complementary digit-line D0*, and a second portion of the second region 72b of the second complementary digit-line D1* may be considered to be laterally adjacent to a portion of the second region 40b of the first true digit-line D0. Further, the first region 72a of the second complementary digit-line D1* may be considered to be laterally adjacent a portion of the first region 42a of the first complementary digit-line D0*.

The interconnect 40c may be referred to as a first interconnect extending from the first region 40a of the first true digit-line D0 to the routing region 50 of the first true digit-line. The interconnect 42c may be referred to as a second interconnect extending from the second region 42b of the first complementary digit-line D0* to the routing region 56 of the first complementary digit-line. The interconnect 70c may be referred to as a third interconnect extending from the second region 70b of the second true digit-line D1 to the routing region 76 of the second true digit-line. The interconnect 72c may be referred to as a fourth interconnect extending from the first region 72a of the second complementary digit-line D1* to the routing region 79 of the second complementary digit-line.

In the illustrated embodiment, wordlines 32 extend from the first subset 46a of the first memory cells associated with the digit-line D0 to the second subset 74b of the third memory cells associated with the digit-line D1. Also, wordlines 32 extend from the second subset 46b of the first memory cells associated with the digit-line D0 to the first subset 74a of the third memory cells associated with the digit-line D1. Additionally, wordlines 32 extend from the third subset 46c of the first memory cells associated with the digit-line D0 to the third subset 78c of the fourth memory cells associated with the digit-line D1*. Additionally, wordlines 32 extend from the first subset 52a of the second memory cells associated with the digit-line D0* to the second subset 78b of the fourth memory cells associated with the digit-line D1*. Also, wordlines 32 extend from the second subset 52b of the second memory cells associated with the digit-line D0* to the first subset 78a of the fourth memory cells associated with the digit-line D1*. Additionally, wordlines 32 extend from the third subset 52c of the second memory cells associated with the digit-line D0* to the third subset 74c of the third memory cells associated with the digit-line D1.

In some embodiments, the wordlines 32 associated with the memory cells along the first deck 14 may be referred to as first wordlines, and the wordlines associated with the memory cells along the second deck 16 may be referred to as second wordlines. The first wordlines are coupled with the first WORDLINE DRIVER circuitry 31 (SWD-L) and the second wordlines are coupled with the second WORDLINE DRIVER circuitry 33 (SWD-U), in the shown embodiment.

In the illustrated embodiment, the first and second SENSE AMPLIFIER circuitries SA1 and SA3 are diagrammatically indicated to be laterally offset relative to one another within the base 12, and the first and second WORDLINE DRIVER circuitries SWD-L and SWD-U are also diagrammatically indicated to be laterally offset relative to one another within the base 12.

The interconnects (e.g., 40c) are shown without cross-hatching in the illustration of FIG. 6 in order to simplify the illustration, and also the nodes of the capacitors within the memory cells (e.g., 20a) are shown without crosshatching in order to simplify the illustration.

Although the embodiments described herein indicate that there are two memory decks (14, 16) over a base 12, it is to be understood that in other embodiments there may be more than two memory decks over the base.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow. The terms "couple, coupling, coupled, etc." may refer to electrical connections.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first deck over a base, and a second deck over the first deck. A true digit-line has a short first region along the first deck and a long second region along the second deck. A complementary digit-line has a long first region along the first deck and a short second region along the second deck. The true digit-line is comparatively compared to the complementary digit-line through SENSE AMPLIFIER circuitry associated with the base. A first set of first memory cells is associated with the true digit-line. The first set includes a first subset along the short first region, a second subset along a portion of the long second region directly over the first subset, and a third subset along another portion of the long second region. A routing region of the true digit-line extends between the second and third subsets of the first memory cells. A second set of second memory cells is associated with the complementary digit-line. The second set includes a first subset along the short second region, a second subset along a portion of the long first region directly under the first subset, and a third subset along another portion of the long first region. A routing region of the complementary digit-line extends between the second and third subsets of the second memory cells. A first connection extends from the short first region to the routing region of the true digit-line. A second connection extends from the short second region to the routing region of the complementary digit-line.

Some embodiments include an integrated assembly comprising a second deck over a first deck. A true digit-line has a short first region along the first deck and a long second region along the second deck. A complementary digit-line has a long first region along the first deck and a short second region along the second deck. The true digit-line is comparatively compared to the complementary digit-line through SENSE AMPLIFIER circuitry. The short first region and the long first region each have a nearby end adjacent a gap between the short and long first regions. The short second region and the long second region each have a nearby end adjacent a gap between the short and long second regions. A first set of first memory cells is associated with the true digit-line. The first set comprises a first subset of the first memory cells along the short first region, a second subset of the first memory cells along a portion of the long second region, and a third subset of the first memory cells along another portion of the long second region. A routing region of the true digit-line extends between the second and third subsets of the first memory cells. A second set of second memory cells is associated with the complementary digit-line. The second set comprises a first subset of the second memory cells along the short second region, a second subset of the second memory cells along a portion of the long first region, and a third subset of the second memory cells along another portion of the long first region. A routing region of the complementary digit-line extends between the second and third subsets of the second memory cells. A connection from the true digit-line to the SENSE AMPLIFIER circuitry extends downwardly from proximate the nearby end of the short first region. A connection from the complementary digit-line to the SENSE AMPLIFIER circuitry extends downwardly from proximate the nearby end of the long first region. A connection from proximate the nearby end of the short first region extends upwardly to the routing region of the true digit-line. A connection from proximate the nearby end of the short second region extends downwardly to the routing region of the complementary digit-line.

Some embodiments include an integrated assembly having a base comprising first and second SENSE AMPLIFIER circuitries. A first deck is over the base. The first deck comprises a first portion of a first array of first memory cells, and comprises a first portion of a second array of second memory cells. A second deck is over the first deck. The second deck comprises a second portion of the first array of the first memory cells, and comprises a second portion of the second array of the second memory cells. A first true digit-line is associated with the first array. The first true digit-line has a first region associated with the first deck and has a second region associated with the second deck. The second region of the first true digit-line is longer than the first region of the first true digit-line. A first subset of first memory cells is associated with the first region of the first true digit-line. A second subset of the first memory cells is associated with the second region of the first true digit-line and is directly over the first subset of the first memory cells. A third subset of the first memory cells is associated with the second region of the first true digit-line and is laterally displaced from the second subset of the first memory cells by a routing region of the first true digit-line. A first complementary digit-line is associated with the second array. The first complementary digit-line has a first region associated with the first deck and has a second region associated with the second deck. The first true digit-line is comparatively compared to the first complementary digit-line through the first SENSE AMPLIFIER circuitry. The first region of the first complementary digit-line is longer than the second region of the first complementary digit-line. A first subset of second memory cells is associated with the second region of the first complementary digit-line. A second subset of the second memory cells is associated with the first region of the first complementary digit-line and is directly under the first subset of the second memory cells. A third subset of the second memory cells is associated with the first region of the first complementary digit-line and is laterally displaced from the second subset of the second memory cells by a routing region of the first complementary digit-line. A second true digit-line is associated with the first array. The second true digit-line has a first region associated with the first deck and has a second region associated with the second deck. The first region of the second true digit-line is longer than the second region of the second true digit-line. A first portion of the first region of second true digit-line is laterally adjacent the first region of the first true digit-line, and a second portion of the first region of the second true digit-line is laterally adjacent the first region of the first complementary digit-line. The second region of the second true digit-line is laterally adjacent a portion of the second region of the first true digit-line. A first subset of third memory cells is associated with the second region of the second true digit-line; a second subset of the third memory cells is associated with the first region of the second true digit-line and is directly under the first subset of the third memory cells; a third subset of the third memory cells is associated with the first region of the second true digit-line and is laterally displaced from the second subset of the third memory cells by a routing region of the second true digit-line. A second complementary digit-line is associated with the second array. The second true digit-line is comparatively compared to the second complementary digit-line through the second SENSE AMPLIFIER circuitry. The second region of the second complementary digit-line is longer than the first region of the second complementary digit-line. A first portion of the second region of second complementary digit-line is laterally adjacent the second region of the first complementary digit-line, and a second portion of the second region of the second complementary digit-line is laterally adjacent the second region of the first true digit-line. The first region of the second complementary digit-line is laterally adjacent a portion of the first region of the first complementary digit-line. A first subset of fourth memory cells is associated with the first region of the second complementary digit-line. A second subset of the fourth memory cells is associated with the second region of the second complementary digit-line and is directly over the first subset of the fourth memory cells. A third subset of the fourth memory cells is associated with the second region of the second complementary digit-line and is laterally displaced from the second subset of the fourth memory cells by a routing region of the second complementary digit-line. A first interconnect extends from the first region of the first true digit-line to the routing region of the first true digit-line. A second interconnect extends from the second region of the first complementary digit-line to the routing region of the first complementary digit-line. A third interconnect extends from the second region of the second true digit-line to the routing region of the second true digit-line. A fourth interconnect extending from the first region of the second complementary digit-line to the routing region of the second complementary digit-line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a first deck over a base;
a second deck over the first deck;
a true digit-line having a short first region along the first deck and a long second region along the second deck;
a complementary digit-line having a long first region along the first deck and a short second region along the second deck; the true digit-line being comparatively compared to the complementary digit-line through a SENSE AMPLIFIER circuitry associated with the base;
a first set of first memory cells associated with the true digit-line; the first set comprising a first subset along the short first region, a second subset along a portion of the long second region directly over the first subset, and a third subset along another portion of the long second region; a routing region of the true digit-line extending between the second and third subsets of the first memory cells;
a second set of second memory cells associated with the complementary digit-line; the second set comprising a first subset along the short second region, a second subset along a portion of the long first region directly under the first subset, and a third subset along another portion of the long first region; a routing region of the complementary digit-line extending between the second and third subsets of the second memory cells;
a first connection extending from the short first region to the routing region of the true digit-line; and
a second connection extending from the short second region to the routing region of the complementary digit-line.

2. The integrated assembly of claim 1 wherein the first and second subsets of the first memory cells comprise a same number of the first memory cells as one another.

3. The integrated assembly of claim 2 wherein the third subset of the first memory cells comprises more of the first memory cells than the first subset of the first memory cells.

4. The integrated assembly of claim 3 wherein the third subset of the first memory cells comprises at least twice as many of the first memory cells as the first subset of the first memory cells.

5. The integrated assembly of claim 3 wherein the third subset of the first memory cells comprises at least three-times as many of the first memory cells as the first subset of the first memory cells.

6. The integrated assembly of claim 3 wherein the third subset of the first memory cells comprises at least four-times as many of the first memory cells as the first subset of the first memory cells.

7. The integrated assembly of claim 3 wherein the first and second subsets of the first memory cells each comprise two of the first memory cells, and wherein the third subset of the first memory cells comprises six of the first memory cells.

8. An integrated assembly, comprising:
a second deck over a first deck;
a true digit-line having a short first region along the first deck and a long second region along the second deck;
a complementary digit-line having a long first region along the first deck and a short second region along the second deck; the true digit-line being comparatively compared to the complementary digit-line through a SENSE AMPLIFIER circuitry; the short first region and the long first region each having a nearby end adjacent a gap between the short and long first regions; the short second region and the long second region each having a nearby end adjacent a gap between the short and long second regions;
a first set of first memory cells associated with the true digit-line; the first set comprising a first subset of the first memory cells along the short first region, a second subset of the first memory cells along a portion of the long second region, and a third subset of the first memory cells along another portion of the long second region; a routing region of the true digit-line extending between the second and third subsets of the first memory cells;
    a second set of second memory cells associated with the complementary digit-line; the second set comprising a first subset of the second memory cells along the short second region, a second subset of the second memory cells along a portion of the long first region, and a third subset of the second memory cells along another portion of the long first region; a routing region of the complementary digit-line extending between the second and third subsets of the second memory cells;
    a connection from the true digit-line to the SENSE AMPLIFIER circuitry extending downwardly from proximate the nearby end of the short first region;
    a connection from the complementary digit-line to the SENSE AMPLIFIER circuitry extending downwardly from proximate the nearby end of the long first region;
    a connection from proximate the nearby end of the short first region extending upwardly to the routing region of the true digit-line; and
    a connection from proximate the nearby end of the short second region extending downwardly to the routing region of the complementary digit-line.

9. The integrated assembly of claim 8 wherein the memory cells comprise storage elements coupled with access devices.

10. The integrated assembly of claim 9 wherein the storage elements are capacitors.

11. The integrated assembly of claim 10 wherein the capacitors are ferroelectric capacitors.

12. The integrated assembly of claim 10 wherein the capacitors are non-ferroelectric capacitors.

13. The integrated assembly of claim 10 wherein the capacitors have container-shaped bottom electrodes, and have upper electrodes extending into interior regions of the container-shaped bottom electrodes.

14. The integrated assembly of claim 9 wherein the access devices are vertically-extending transistors.

15. The integrated assembly of claim 8 wherein the first and second subsets of the first memory cells comprise a same number of the first memory cells as one another.

16. The integrated assembly of claim 15 wherein the third subset of the first memory cells comprises more of the first memory cells than the first subset of the first memory cells.

17. The integrated assembly of claim 16 wherein the third subset of the first memory cells comprises at least about twice as many of the first memory cells as the first subset of the first memory cells.

18. The integrated assembly of claim 16 wherein the third subset of the first memory cells comprises at least about three-times as many of the first memory cells as the first subset of the first memory cells.

19. An integrated assembly, comprising:
    a base comprising first and second SENSE AMPLIFIER circuitries;
    a first deck over the base; the first deck comprising a first portion of a first array of first memory cells, and comprising a first portion of a second array of second memory cells;
    a second deck over the first deck; the second deck comprising a second portion of the first array of the first memory cells, and comprising a second portion of the second array of the second memory cells;
    a first true digit-line associated with the first array, the first true digit-line having a first region associated with the first deck and having a second region associated with the second deck; the second region of the first true digit-line being longer than the first region of the first true digit-line; a first subset of first memory cells being associated with the first region of the first true digit-line; a second subset of the first memory cells being associated with the second region of the first true digit-line and being directly over the first subset of the first memory cells; a third subset of the first memory cells being associated with the second region of the first true digit-line and being laterally displaced from the second subset of the first memory cells by a routing region of the first true digit-line;
    a first complementary digit-line associated with the second array, the first complementary digit-line having a first region associated with the first deck and having a second region associated with the second deck; the first true digit-line being comparatively compared to the first complementary digit-line through the first SENSE AMPLIFIER circuitry; the first region of the first complementary digit-line being longer than the second region of the first complementary digit-line; a first subset of second memory cells being associated with the second region of the first complementary digit-line; a second subset of the second memory cells being associated with the first region of the first complementary digit-line and being directly under the first subset of the second memory cells; a third subset of the second memory cells being associated with the first region of the first complementary digit-line and being laterally displaced from the second subset of the second memory cells by a routing region of the first complementary digit-line;
    a second true digit-line associated with the first array; the second true digit-line having a first region associated with the first deck and having a second region associated with the second deck; the first region of the second true digit-line being longer than the second region of the second true digit-line; a first portion of the first region of second true digit-line being laterally adjacent the first region of the first true digit-line, and a second portion of the first region of the second true digit-line being laterally adjacent the first region of the first complementary digit-line; the second region of the second true digit-line being laterally adjacent a portion of the second region of the first true digit-line; a first subset of third memory cells being associated with the second region of the second true digit-line; a second subset of the third memory cells being associated with the first region of the second true digit-line and being directly under the first subset of the third memory cells; a third subset of the third memory cells being associated with the first region of the second true digit-line and being laterally displaced from the second subset of the third memory cells by a routing region of the second true digit-line;
    a second complementary digit-line associated with the second array; the second true digit-line being comparatively compared to the second complementary digit-line through the second SENSE AMPLIFIER circuitry; the second region of the second complementary digit-line being longer than the first region of the second complementary digit-line; a first portion of the second region of second complementary digit-line being laterally adjacent the second region of the first complementary digit-line, and a second portion of the second region of the second complementary digit-line being laterally adjacent the second region of the first true digit-line; the first region of the second complementary digit-line being laterally adjacent a portion of the first region of the first complementary digit-line; a first subset of fourth memory cells being associated with the first region of the second complementary digit-line; a second subset of the fourth memory cells being associated with the second region of the second complementary digit-line and being directly over the first subset of the fourth memory cells; a third subset of the fourth memory cells being associated with the second region of the second complementary digit-line and being laterally displaced from the second subset of the fourth memory cells by a routing region of the second complementary digit-line;

a first interconnect extending from the first region of the first true digit-line to the routing region of the first true digit-line;

a second interconnect extending from the second region of the first complementary digit-line to the routing region of the first complementary digit-line;

a third interconnect extending from the second region of the second true digit-line to the routing region of the second true digit-line; and a fourth interconnect extending from the first region of the second complementary digit-line to the routing region of the second complementary digit-line.

20. The integrated assembly of claim 19 comprising wordlines extending from first subset of the first memory cells to the second subset of the third memory cells.

21. The integrated assembly of claim 19 comprising wordlines extending from second subset of the first memory cells to the first subset of the third memory cells.

22. The integrated assembly of claim 19 comprising wordlines extending from third subset of the first memory cells to the third subset of the fourth memory cells.

23. The integrated assembly of claim 19 comprising wordlines extending from first subset of the second memory cells to the second subset of the fourth memory cells.

24. The integrated assembly of claim 19 comprising wordlines extending from second subset of the second memory cells to the first subset of the fourth memory cells.

25. The integrated assembly of claim 19 comprising wordlines extending from third subset of the second memory cells to the third subset of the third memory cells.

26. The integrated assembly of claim 19 wherein:
first wordlines are associated with memory cells along the first deck;
second wordlines are associated with memory cells along the second deck;
the first wordlines are coupled with first WORDLINE DRIVER circuitry; and
the second wordlines are coupled with second WORDLINE DRIVER circuitry.

27. The integrated assembly of claim 26 wherein:
the first and second SENSE AMPLIFIER circuitries are laterally offset relative to one another within the base; and
the first and second WORDLINE DRIVER circuitries are laterally offset relative to one another within the base.

28. The integrated assembly of claim 19 wherein the first subsets of each of the first, second and third sets of memory cells comprise about one-third as many memory cells as the third subsets of each of the first, second and third sets of memory cells.

29. The integrated assembly of claim 28 wherein the second subsets of each of the first, second, third and fourth sets of memory cells comprise about a same number of memory cells as the first subsets of each of the first, second, third and fourth sets of memory cells.

* * * * *